United States Patent
Offrein et al.

(10) Patent No.: US 11,615,843 B2
(45) Date of Patent: Mar. 28, 2023

(54) CONTROLLING VOLTAGE RESISTANCE THROUGH METAL-OXIDE DEVICE

(71) Applicant: International Business Machines Corporation, Armonk, NY (US)

(72) Inventors: Bert Jan Offrein, Schoenenberg (CH); Jean Fompeyrine, Waedenswil (CH); Valeria Bragaglia, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 186 days.

(21) Appl. No.: 17/124,648

(22) Filed: Dec. 17, 2020

(65) Prior Publication Data
US 2022/0199158 A1    Jun. 23, 2022

(51) Int. Cl.
*G11C 13/00*    (2006.01)
*H01L 45/00*    (2006.01)
*G06F 3/14*    (2006.01)

(52) U.S. Cl.
CPC ...... *G11C 13/0069* (2013.01); *G11C 13/0011* (2013.01); *H01L 45/085* (2013.01);
(Continued)

(58) Field of Classification Search
CPC ............ G11C 13/0069; G11C 13/0011; G11C 2013/0078; G11C 13/0007;
(Continued)

(56) References Cited

U.S. PATENT DOCUMENTS 8,530,873 B2    9/2013    Yang
9,275,728 B2    3/2016    Srinivasan
(Continued)

FOREIGN PATENT DOCUMENTS

CN    106299106 A  *  1/2017
CN    107346449 A     11/2017
(Continued)

OTHER PUBLICATIONS

"Patents Act 1977: Combined Search and Examination Report under Sections 17 and 18(3)", Applicant's file reference DP/P49950GB, International application No. GB2117332.3, dated Mar. 18, 2022, 9 pages.
(Continued)

*Primary Examiner* — Fernando Hidalgo
(74) *Attorney, Agent, or Firm* — Brian M. Restauro

(57) ABSTRACT

Embodiments of the present invention provide a computer system, a voltage resistance controlling apparatus, and a method that comprises at least two electrodes on proximal endpoints; a first layer disposed on the at least two electrodes, wherein the first layer is a made of a metal-oxide; a second layer disposed on the second layer, wherein the second first layer is made of an electrically conductive metal-oxide; a forming contact disposed on the second layer, wherein a combination of the forming contact disposed on the first layer disposed on the second layer operatively connects the at least two electrodes; and a computer system operatively connected to the forming contact, wherein the computer system is configured to apply a predetermined voltage to the first layer and the second layer respectively and display an overall resistance increase using a user interface.

20 Claims, 4 Drawing Sheets

(52) U.S. Cl.
CPC ............ H01L 45/1233 (2013.01); *G06F 3/14* (2013.01); *G11C 2013/0078* (2013.01)

(58) Field of Classification Search
CPC . G11C 2213/52; G11C 13/003; H01L 45/085; H01L 45/1233; H01L 45/1206; H01L 45/08; H01L 45/12; H01L 45/145; G06F 3/14; G06N 3/0635
USPC ........................................................ 365/148
See application file for complete search history.

(56) References Cited

U.S. PATENT DOCUMENTS

| | | | |
|---|---|---|---|
| 9,570,683 B1 | 2/2017 | Jo | |
| 10,460,804 B2 | 10/2019 | Bauer | |
| 2014/0175371 A1 | 6/2014 | Karpov | |
| 2018/0108412 A9* | 4/2018 | Bauer | G11C 13/0009 |
| 2019/0288195 A1 | 9/2019 | Lu | |
| 2019/0305220 A1* | 10/2019 | Jha | G11C 13/0007 |
| 2020/0083440 A1* | 3/2020 | Hersam | G11C 13/0007 |
| 2020/0387422 A1 | 12/2020 | Bell | |
| 2021/0313393 A1* | 10/2021 | Wei | H01F 10/329 |
| 2022/0093858 A1* | 3/2022 | Hsu | H01L 45/1253 |

FOREIGN PATENT DOCUMENTS

| | | | | |
|---|---|---|---|---|
| EP | 1643508 A2 * | 4/2006 | ......... | G11C 13/0007 |
| WO | 2019174032 A1 | 9/2019 | | |

OTHER PUBLICATIONS

Wang et al., "Bifunctional NbS 2-Based Asymmetric Heterostructure for Lateral and Vertical Electronic Devices", ResearchGate, Article in ACS Nano—Dec. 2019, DOI: 10.1021/acsnano.9b06627, 11 pages.

Sangwan et al., "Gate-tunable Memristive Phenonmena Mediated by Grain Boundaries in Single-Layer MoS2", ResearchGate, Article in Nature Nanotechnology—Apr. 2015, DOI: 10.1038/nnano.2015.56, 5 pages.

* cited by examiner

CONTROLLING VOLTAGE RESISTANCE THROUGH METAL-OXIDE DEVICE

BACKGROUND

The present invention relates generally to the field of voltage resistance, specifically controlling voltage resistance through a metal-oxide device.

A memristor is a non-linear two-terminal electrical component relating electric conductivity and voltage. Voltage is the difference in electric potential between two points, which in a static electric field, is defined as the work needed per unit of charge to move a test charge between two points. Electrical resistance of an object is a measure of its opposition to the flow of electrical current. The resistance of an object depends in large part on the material it is made of Objects made of electrical insulators like rubber tend to have a very high resistance and low conductivity, while objects made of electrical conductors like metals tend to have very low resistance and high conductivity.

Metal oxides are amorphous or crystalline solids that contain a metal cation and an oxide anion. Metal oxides typically react with water to from bases or with acids to form salts. An oxide is a chemical compound that contains at least one oxygen atom and one other element in its chemical formula. Oxide is a dianion of oxygen. Certain elements can form multiple oxides, differing in the amounts of the element combining with the oxygen. Examples are carbon, iron, nitrogen, silicon, titanium, and aluminum. In such cases, the oxides are distinguished by specifying the numbers of atoms involved or by specifying the oxidation number of the element.

SUMMARY

Embodiments of the present invention provide a computer system, a voltage resistance controlling apparatus, and a method that comprises at least two electrodes on proximal endpoints; a first layer disposed on the at least two electrodes, where the first layer is a made of a metal-oxide; a second layer disposed on the second layer, where the second first layer is made of an electrically conductive metal-oxide; a forming contact disposed on the second layer, where a combination of the forming contact disposed on the first layer disposed on the second layer operatively connects the at least two electrodes; and a computer system operatively connected to the forming contact, where the computer system is configured to apply a predetermined voltage to the first layer and the second layer respectively and display an overall resistance increase using a user interface.

DETAILED DESCRIPTION

Embodiments of the present invention recognize the need to provide more efficient systems and methods for controlling voltage resistance using a memristive apparatus for calculating a plurality of synaptic connections within a neural network. Typically, the resistance range within a filamentary type memristive apparatus is 100 ohms to 10 kiloohms, which limits the voltage resistance and potentially a ratio of the highest and lowest resistive states of the memristive apparatus. In some instances, a conductive filament of oxygen vacancies is formed in a metal-oxide by applying a current or voltage and switching between a high and low resistive state is obtained by applying a negative or positive charge. Embodiments of the present invention provide efficient systems and method for controlling voltage resistance by increasing the resistance of a plurality of filament layers associated with a metal-oxide apparatus. Embodiments of the present invention provide efficient systems and method for controlling voltage resistance by increasing the resistance within a memristive apparatus via a concatenation of filamentary sections, which reduces the inefficient consumption of power. Embodiments of the present invention provide cost-effective systems and methods for controlling voltage resistance by simultaneously tuning the plurality of filaments using a predetermined voltage, creating a minimum overhead at a system level and enhanced control of the resistance associated with the memristive apparatus based on the predetermined voltage applied through the plurality of filaments. Embodiments of the present invention provide efficient and cost-effective systems and methods for controlling voltage resistance by applying at least two filamentary conductive channels in a first metal-oxide; controlling an individual tuning of a conductance through the at least filaments; and enforcing a current laterally through a second metal-oxide layer and through the two or more filaments in the first metal-oxide. In this manner, as discussed in greater detail in this specification, embodiments of the present invention can be used to increase resistance within a plurality of filament layers associated with a metal-oxide apparatus by controlling a voltage applied to each respective filament layer within the plurality of filament layers.

Figure 1:
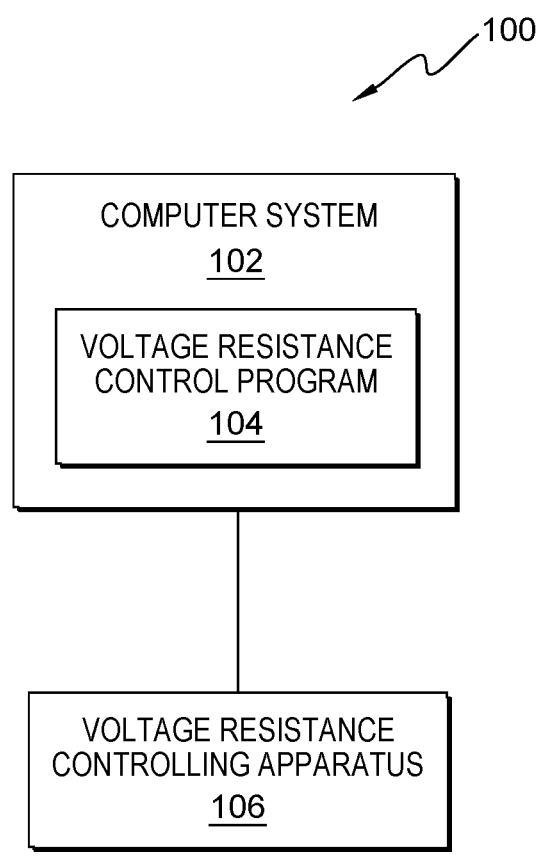
FIG. 1 is a block diagram of a voltage resistance controlling system, in accordance with at least one embodiment of the present invention.

FIG. 1 is a functional block diagram of a voltage resistance controlling system 100, in accordance with an embodiment of the present invention. Voltage resistance controlling system 100 includes computer system 102 and voltage resistance controlling apparatus 106. In some embodiments, computer system 102 can be an integrated, on board component of voltage resistance controlling apparatus 106. In general, computer system 102, is representative of any electronic devices, or combination of electronic devices, capable of executing machine-readable program instructions, as described in greater detail with regard to FIG. 4.

Computer system 102 includes voltage resistance control program 104. Voltage resistance control program 104 (hereinafter "the program 104") increases the resistance and enhances control of resistance of a voltage resistance controlling apparatus 106 by generating a current at a predetermined voltage laterally through a plurality of filament layers associated with voltage resistance controlling apparatus 106 via data cable 108, as discussed in greater detail with regard to FIG. 3. In another embodiment, the voltage resistance controlling apparatus 106 increases the resistance and enhance control of the resistance of an external device using the program 104, which is locally stored on the voltage resistance controlling apparatus 106. In this embodiment, the program 104 applies the predetermined voltage to the voltage resistance controlling apparatus 106. The term "voltage resistance", as used herein, refers to the measure of opposition to the flow of current (i.e., voltage) that is applied to at least two filament layers associated with voltage resistance controlling apparatus 106. In this embodiment, controlling the individual resistance of each respective filament sections within the filament layer enables enhanced control of voltage resistance by individual tuning of each respective filament section based on the individual application of a predetermined voltage across the plurality of filament sections (e.g., between a first metal-oxide layer and a second metal-oxide layer) within voltage resistance controlling apparatus 106. Data transmitted by voltage resistance control apparatus 106 can include transmitting instructions to enable a direct exchange of oxygen between the second metal-oxide layer and at least one filament section associated with the first metal-oxide layer, which modifies the stoichiometric arrangements associated with the elements comprising the metal-oxide layers.

Figure 2A:
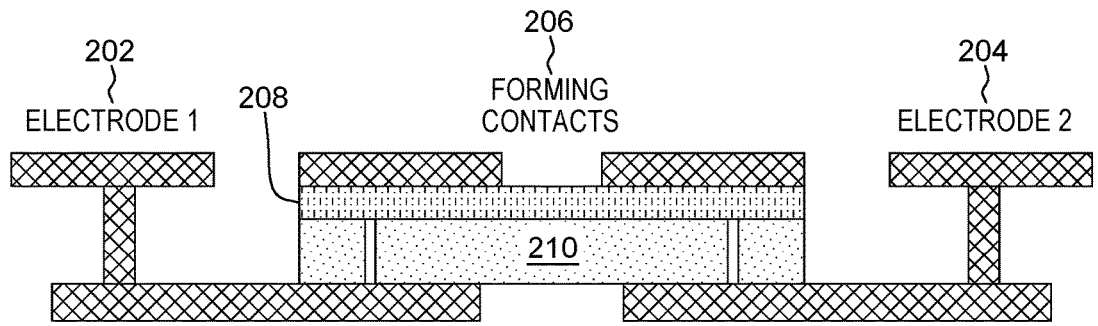
FIG. 2A is an exploded view of a voltage resistance controlling apparatus, in accordance with at least one embodiment of the present invention.

FIG. 2A is a cross-sectional view of voltage resistance control apparatus 106. Voltage resistance control apparatus 106 includes a first electrode 202 and a second electrode 204 as proximal endpoints. In this embodiment, a first layer 210 made of a metal-oxide is disposed on the first electrode 202 and the second electrode 204. For example, silicon dioxide, $SiO_2$, and titanium dioxide, $TiO_2$, are examples of metal-oxides. In this embodiment, a second layer 208 made of an electrically conductive metal oxide is disposed on the first layer 210. In another embodiment, the second layer 208 is made of a metal-oxide and an electrical insulator. Electrical insulator is defined as a material that does not allow the electrons to flow freely, which means a low amount of electric current can flow through the material. For example, electrical insulators are glass, paper, and Teflon. In this embodiment, a forming contact 206 made of a conductive metal is disposed on the second layer 208. In this embodiment, the combination of the forming contact 206 disposed on the second layer 208 disposed on the first layer 210 is defined as a layered forming contact. In this embodiment, the layered forming contact operatively connects the first electrode 202 and the second electrode 204.

In this embodiment, the first layer 210 contains a plurality of filament sections, where the voltage resistance of each filament section within the plurality of filament sections is controlled through the application of a predetermined voltage within the first layer 210. In this embodiment, the plurality of filament sections within the second layer modify the resistance of the second layer 208 via the application of the predetermined voltage. In this embodiment, the program 104 applies the predetermined voltage to the plurality of filament sections with the first layer 210. In another embodiment, the voltage resistance control program 104 applies the predetermined voltage to the second layer 208 and the first layer 210. In this embodiment, the program 104 can apply a different voltage to the first layer 210. In another embodiment, the program 104 applies the predetermined voltage laterally through the plurality of filament sections within the first layer 210. In this embodiment, the second layer 208 is made of a metal-oxide that displays a resistance dependence based on modifying the stoichiometry via the application of the predetermined voltage of the plurality of filament sections within the first layer 210. In this embodiment, the first layer 210 is a dielectric, which is defined as having the property of transmitting electric force without conduction. In this embodiment, the preferred material of the first layer 210 is hafnium dioxide, $HfO_2$. In this embodiment, the second layer 208 is made of a different metal-oxide than the first layer 210 and has a high electrical conductivity. In this embodiment, the preferred material of the second layer 208 is tungsten oxide, $WO_{3-x}$. In another embodiment, preferred materials of the metal oxide used within the second layer 208 are silicon dioxide, $SiO_2$, and titanium dioxide, $TiO_2$.

In certain embodiments, the program 104 applies the same predetermined voltage at the first electrode 202 and the second electrode 204. In other embodiments, the program 104 applies a different predetermined voltage to the forming contact 206 than the predetermined voltage applied to the first electrode 202 and the second electrode 204. In certain embodiments, the application of the differing predetermined voltages occurs sequentially, where a first predetermined voltage is applied to the first electrode 202 and the second electrode 204 followed by a second predetermined voltage that is applied to the forming contact 206. In another embodiment, the application of the first predetermined voltage and the second predetermined voltage is simultaneous. In this embodiment, the program 104 individually controls a resistive state of the plurality of filament layers by applying differing predetermined voltages to the first and second electrodes 202, 204 and the forming contact 206. In this embodiment, the program 104 increases an overall resistance of the voltage resistance controlling apparatus 106 by selectively trimming the resistance within at least one section in a plurality of sections located within the first layer 210 and the second layer 208 using the lateral application of the predetermined voltage, which dynamically increases the range of resistance associated with the voltage resistance controlling apparatus 106.

Figure 2B:
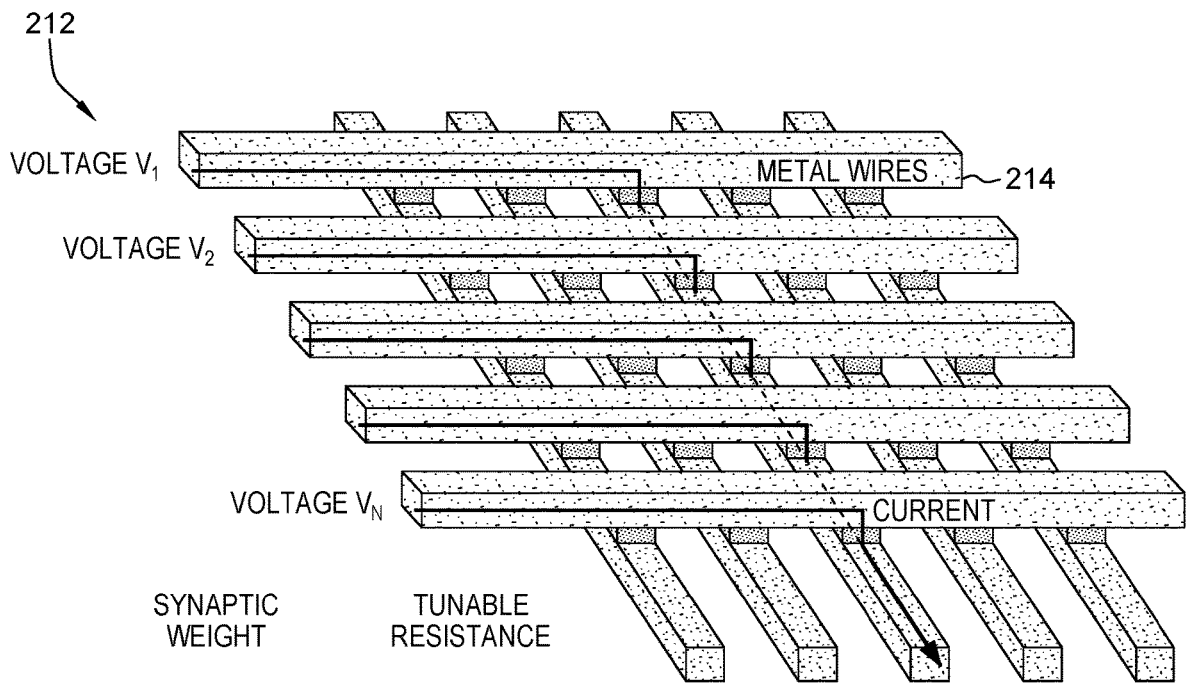
FIG. 2B is an assembled view of the voltage resistance controlling apparatus, in accordance with at least one embodiment of the present invention.

FIG. 2B is an expanded view of voltage resistance controlling apparatus 106. Voltage resistance controlling apparatus 106 is in a crossbar array 212 configuration. In this embodiment, the program 104 applies the first predetermined voltage to at least one set of bars within a plurality of bars associated with the crossbar array 212. In this embodiment, the program 104 applies the second predetermined voltage to at least one other set of bars with the plurality of bars associated with the crossbar array. In this embodiment, electrical wires 214 interconnect the plurality of the bars associated with the crossbar array 212. In this embodiment, electrical wires are disposed operatively throughout the first layer 210 and the second layer 208 such that the electrical wires connect the two, with each respective filament layer associated with a respective metal-oxide. In this embodiment, the voltage resistance controlling apparatus 106 with the crossbar array 212 configuration calculates a plurality of synaptic connections in neural networks for efficient operation of an analog synaptic accelerator by individually tuning a plurality of filament layers by applying a predetermined voltage that interacts with the plurality of metal-oxide layers, which results in an increased resistance range of 100 Ohms ("100Ω") to 10,000 ("10,000Ω") Ohms (i.e., 10 kΩ).

Figure 3:
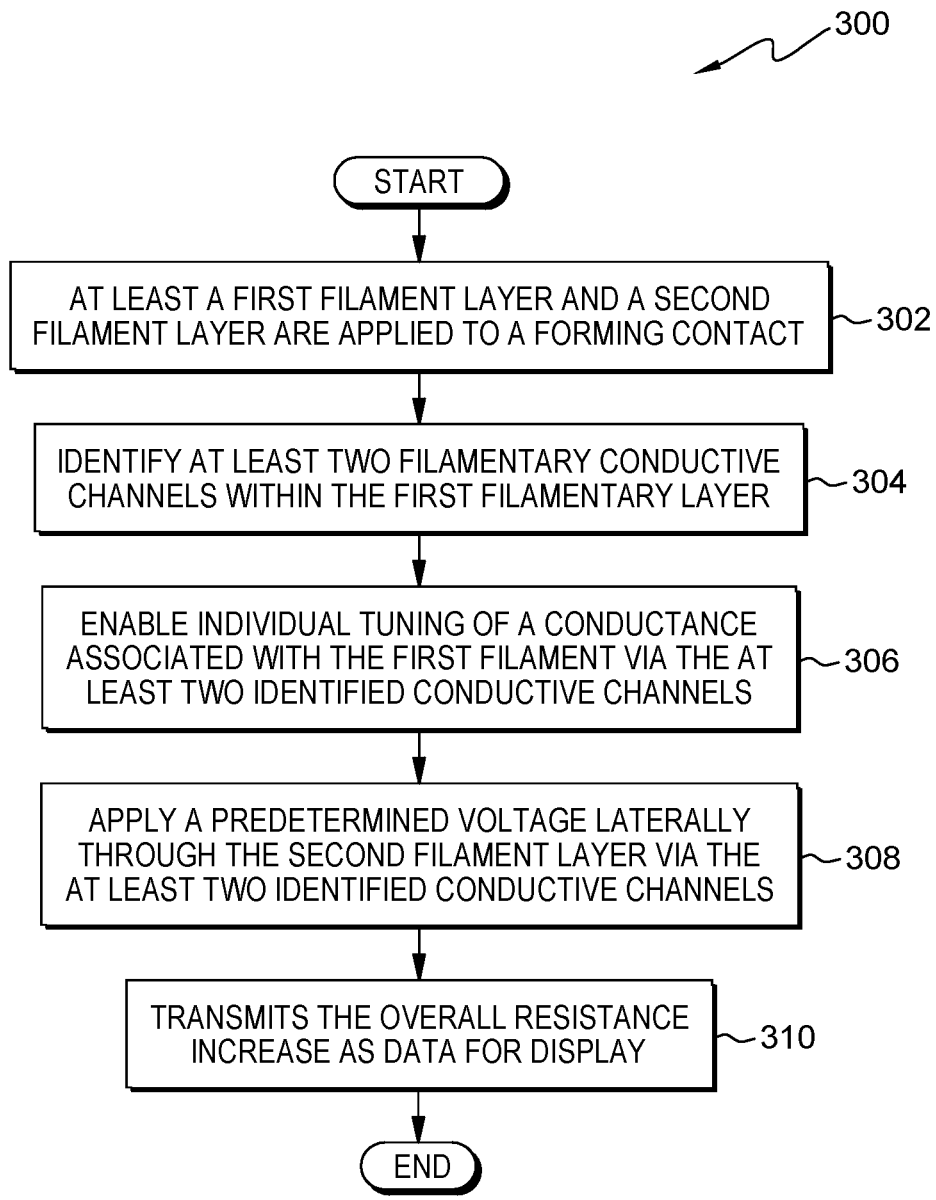
FIG. 3 is a flowchart illustrating operational steps for controlling voltage resistance in a metal-oxide apparatus, in accordance of at least one embodiment of the present invention.

FIG. 3 is a flowchart 300 illustrating operational steps for dynamically controlling voltage resistance within a voltage resistance control apparatus, in accordance with at least one embodiment.

In step 302, the program 104 analyzes the voltage resistance control apparatus 106. In this embodiment, the voltage resistance control apparatus 106 includes a first electrode 202 and a second electrode 204 as proximal endpoints. In this embodiment, a first layer 210 made of a metal-oxide is disposed on the first electrode 202 and the second electrode 204. In this embodiment, a second layer 208 made of an electrically conductive metal oxide is disposed on the first layer 210. In this embodiment, a forming contact 206 made of a conductive metal is disposed on the second layer 208. In this embodiment, the combination of the forming contact 206 disposed on the second layer 208 disposed on the first layer 210 is defined as a layered forming contact. In this embodiment, the layered forming contact operatively connects the first electrode 202 and the second electrode 204.

In this embodiment, the forming contact 206 made of a conductive metal is disposed on the second layer 208 made of a first metal-oxide is disposed by directly placing the forming contact 206 on the second layer 208 through an anodic oxidation, which exposes the second layer 208 to oxygen particles. In response to disposing the forming contact 206 on the second layer 208 disposed on the first layer 210, the first layer 210 is made of a metal oxide that is different from the metal-oxide associated with the second layer 208. For example, the second layer 208 is disposed to the first layer 210 within a voltage resistance controlling apparatus 106 through an anodic oxidation process. In this example, the second layer 208 made of tungsten oxide, $WO_{3-x}$, is disposed on the first layer 210 made of hafnium dioxide, $HfO_2$, within the voltage resistance controlling apparatus 106 though a different anodic oxidation process.

In step 304, the program 104 identifies at least two filamentary conductive channels within the first layer 210 of the voltage resistance control apparatus 106. In this embodiment, the program 104 identifies the at least two filamentary conductive channels by transmitting charged ions through a plurality of porous openings within the first layer 210 and determining a flow of charged ions through at least two filamentary conductive channels by using a plurality of sensor devices at two fixed periods of time, an artificial intelligence algorithm, and a machine learning algorithm. For example, the program 104 identifies two filamentary conductive channels using a first sensor device and determines that the flow of charged ions at a first fixed period of time results in a voltage of −1.2 V. In this example and in response to the application of the predetermined voltage to the first layer 210, the program 104 determines that the flow of charged ions at a second fixed period of time result in a voltage of 0.8 V. In this embodiment, the program 104 identifies the at least two filamentary conductive channels by determining the flow of charged ions due to charged ions requiring a conductive medium to transport charged ions through the first layer 210. In another embodiment and in response to transmitting charged ions through a non-conducive filamentary channel, the program 104 reduces the movement of the charged ions through dissolution.

In step 306, the program 104 enables individual tuning of a conductance associated with the first layer 210 via the at least two identified filamentary conductive channels. In this embodiment, the program 104 transmits instructions to the voltage resistance controlling apparatus 106 to apply a first predetermined voltage throughout the second layer 208 and the first layer 210. In another embodiment, the program 104 transmits instructions to the voltage resistance controlling apparatus 106 to individually tune a plurality of sections associated with the first layer 210 respectively by selectively trimming the resistance of the plurality of individual filament sections using the application of the predetermined voltage. In this embodiment, the program 104 simultaneously tunes the plurality of filament sections of the first layer 210 by uniformly applying the predetermined voltage laterally through the plurality of filament sections within the first layer 210. In another embodiment, the program 104 sequentially tunes the plurality of filament sections of the first layer 210 in delaying the application of the predetermined voltage multiple sections within the plurality of filament sections. In this embodiment, the simultaneous tuning of the plurality of filament sections of the first layer 210 increase the overall resistance and dynamically increase the resistance range of the voltage resistance controlling apparatus 106 by modifying the stoichiometry of the second layer 208 and the forming contact 206.

In step 308, the program 104 applies a predetermined voltage laterally through the first layer 210 via the at least two identified filamentary conductive channels. In this embodiment, the program 104 applies the predetermined voltage to each filament section within the plurality of filament sections located within the first layer 210. In this embodiment, the program 104 uses the stoichiometric arrangements of the dielectric metal-oxide associated with the first layer 210 and the conductive metal-oxide associated with the second layer 208 respectively to determine the voltage. In this embodiment and in response to applying the predetermined voltage laterally through the first layer 210, the predetermined voltage travels through the second layer 208 and the forming contact 206 via the at least two identified filamentary conductive channels, which modifies the voltage resistance of the second layer 208 and the forming contact 206.

In step 310, the program 104 transmits the overall resistance increase as data for display. In this embodiment, the program 104 displays the increase in overall resistance associated with the voltage resistance controlling apparatus 106 on the computing system 102 via a user interface. In this embodiment, the program 104 displays the increase in overall resistance as line graph with an x-axis defined as charge with a range of −1.2 V to 0.8 V and a y-axis defined as absolute value of electrical current and area with a range of $10^{-7}$ W/m$^2$ to $10^{-3}$ W/m$^2$. In this embodiment, W/m$^2$ is defined as watt per square meter. For example, a voltage resistance controlling apparatus 106 prior to the application of the predetermined voltage peaks at 0.6 V and $10^{-4}$ W/m$^2$. In this example and in response to the application of the predetermined voltage, the voltage resistance apparatus 106 peaks at 0.8 V and $10^{-3}$ W/m$^2$. Therefore, the application of the predetermined voltage within the voltage resistance controlling apparatus 106 increases the overall resistance by at 0.2 V.

Figure 4:
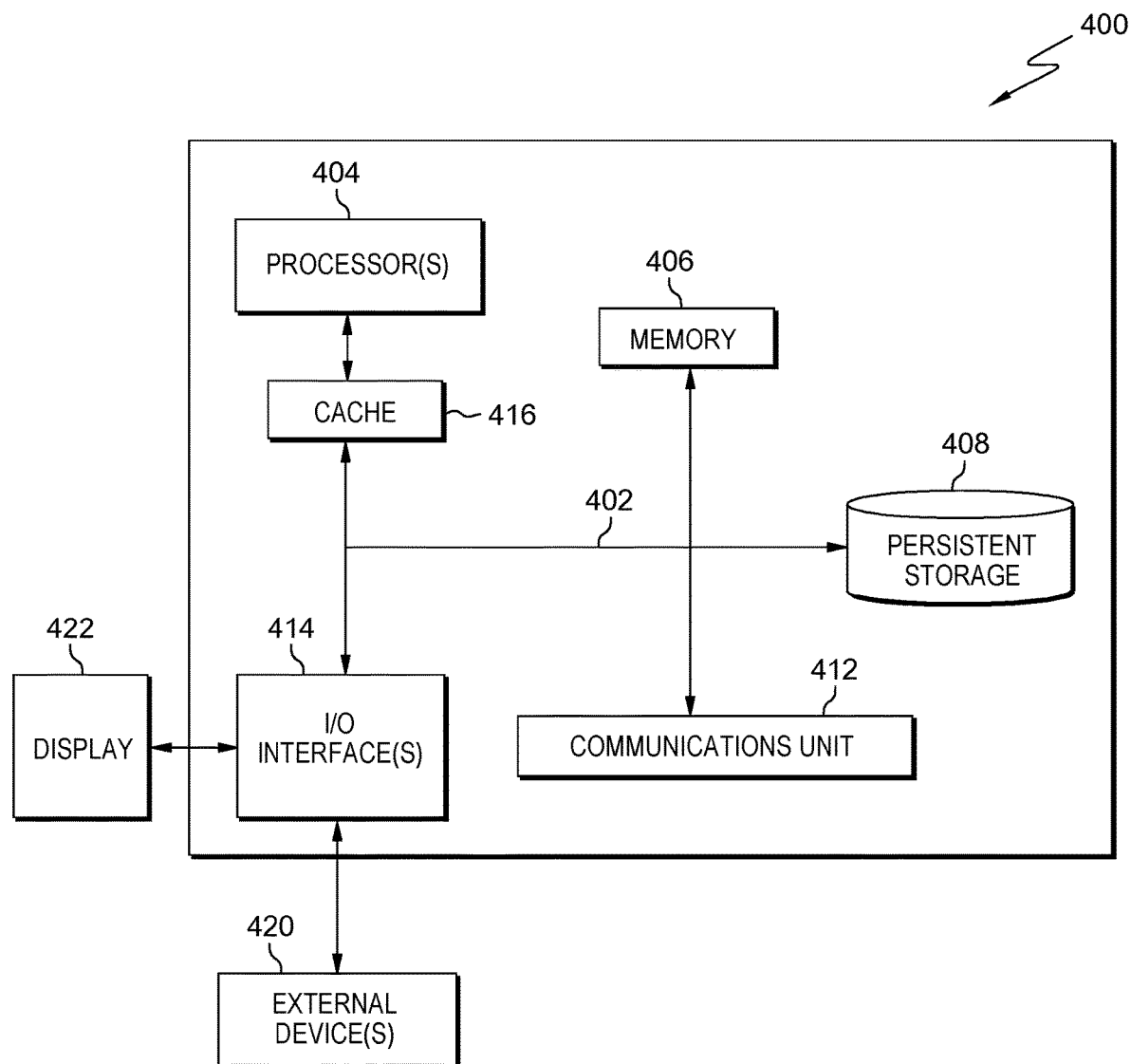
FIG. 4 is a block diagram of internal and external components of the computer systems of FIG. 1, in accordance of at least one embodiment of the present invention.

FIG. 4 is a block diagram of internal and external components of a computer system 400, which is representative the computer systems of FIG. 1, in accordance with an embodiment of the present invention. It should be appreciated that FIG. 4 provides only an illustration of one implementation and does not imply any limitations with regard to the environments in which different embodiments may be implemented. In general, the components illustrated in FIG. 4 are representative of any electronic device capable of executing machine-readable program instructions. Examples of computer systems, environments, and/or configurations that may be represented by the components illustrated in FIG. 4 include, but are not limited to, personal computer systems, server computer systems, thin clients, thick clients, laptop computer systems, tablet computer systems, cellular telephones (e.g., smart phones), multiprocessor systems, microprocessor-based systems, network PCs, minicomputer systems, mainframe computer systems, and distributed cloud computing environments that include any of the above systems or devices.

Computer system 400 includes communications fabric 402, which provides for communications between one or more processors 404, memory 406, persistent storage 408, communications unit 412, and one or more input/output (I/O) interfaces 414. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer-readable storage media. In this embodiment, memory 406 includes random access memory (RAM) 416 and cache memory 418. In general, memory 406 can include any suitable volatile or non-volatile computer-readable storage media. Software is stored in persistent storage 408 for execution and/or access by one or more of the respective processors 404 via one or more memories of memory 406.

Persistent storage 408 may include, for example, a plurality of magnetic hard disk drives. Alternatively, or in addition to magnetic hard disk drives, persistent storage 408 can include one or more solid state hard drives, semiconductor storage devices, read-only memories (ROM), erasable programmable read-only memories (EPROM), flash memories, or any other computer-readable storage media that is capable of storing program instructions or digital information.

The media used by persistent storage 408 can also be removable. For example, a removable hard drive can be used for persistent storage 408. Other examples include optical and magnetic disks, thumb drives, and smart cards that are inserted into a drive for transfer onto another computer-readable storage medium that is also part of persistent storage 408.

Communications unit 412 provides for communications with other computer systems or devices via a network. In this exemplary embodiment, communications unit 412 includes network adapters or interfaces such as a TCP/IP adapter cards, wireless Wi-Fi interface cards, or 3G or 4G wireless interface cards or other wired or wireless communication links. The network can comprise, for example, copper wires, optical fibers, wireless transmission, routers, firewalls, switches, gateway computers and/or edge servers. Software and data used to practice embodiments of the present invention can be downloaded to computer system 102 through communications unit 412 (e.g., via the Internet, a local area network or other wide area network). From communications unit 412, the software and data can be loaded onto persistent storage 408.

One or more I/O interfaces 414 allow for input and output of data with other devices that may be connected to computer system 400. For example, I/O interface 414 can provide a connection to one or more external devices 420, such as a keyboard, computer mouse, touch screen, virtual keyboard, touch pad, pointing device, or other human interface devices. External devices 420 can also include portable computer-readable storage media such as, for example, thumb drives, portable optical or magnetic disks, and memory cards. I/O interface 414 also connects to display 422.

Display 422 provides a mechanism to display data to a user and can be, for example, a computer monitor. Display 422 can also be an incorporated display and may function as a touch screen, such as a built-in display of a tablet computer.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A voltage resistance controlling apparatus, comprising:
   at least two electrodes on adjacent endpoints;
   a first layer disposed on the at least two electrodes, wherein the first layer is a made of a metal-oxide;
   a second layer disposed on the first layer, wherein the second layer is made of an electrically conductive metal-oxide;
   a forming contact disposed on the second layer, wherein a combination of the forming contact disposed on the second layer, the second layer being disposed on the first layer, operatively connects the at least two electrodes; and
   a computer system operatively connected to the forming contact, wherein the computer system is configured to apply a predetermined voltage to the first layer and the second layer respectively and display an overall resistance increase using a user interface.

2. The voltage resistance controlling apparatus of claim 1, wherein the second layer is comprised of an electrically insulating metal-oxide.

3. The voltage resistance controlling apparatus of claim 1, wherein the second layer is comprised of tungsten oxide, $WO_{3-x}$.

4. The voltage resistance controlling apparatus of claim 1, wherein the first layer is comprised of a plurality of filament sections connected through at least two conductive channels.

5. The voltage resistance controlling apparatus of claim 1, wherein the first layer is comprised of a dielectric metal-oxide.

6. The voltage resistance controlling apparatus of claim 1, wherein the first layer is comprised of hafnium dioxide, $HfO_2$.

7. The voltage resistance controlling apparatus of claim 1, further comprising a layered forming contact comprised of the forming contact disposed on the second layer disposed on the first layer, wherein the layered forming contact operatively connects the first electrode and the second electrode.

8. A computer-implemented method comprising:
   identifying at least two filamentary channels within a first layer made of a metal-oxide within a voltage resistance controlling apparatus by using a plurality of sensor devices;
   identifying a plurality of filamentary sections parallel to the at least two filamentary channels within the first layer within the voltage resistance controlling apparatus;
   enabling resistance tuning in at least one identified filamentary section within the plurality of sections parallel to the at least two filamentary channels within the first layer within the voltage resistance controlling apparatus; and
   applying a predetermined voltage laterally through the at least one identified filamentary section within the first layer via the at least two identified filamentary conductive channels.

9. The computer-implemented method of claim 8, wherein identifying the at least two filamentary conductive channels comprises determining a flow of a plurality of charged ions through the first layer, wherein the flow of charged ions require a conductive medium to transport charged ions via the at least two filamentary conductive channels.

10. The computer-implemented method of claim 9, wherein determining the flow of the plurality of charged ions through the first layer comprises:
   determining the flow of the plurality of charged ions through at least the two identified filamentary channels at a first fixed period of time; and
   determining the flow of the plurality of charged ions through the at least two identified filamentary channels at a second fixed period of time, wherein there is a difference of at least three seconds between the first fixed period of time and the second period of time.

11. The computer-implemented method of claim 8, wherein enabling resistance tuning in at least one identified filamentary section comprises transmitting instructions to the plurality of the identified filamentary sections to receive charged ions through the at least two filamentary channels within the first layer.

12. The computer-implemented method of claim 8, wherein enabling resistance tuning in at least one identified filamentary section comprises selectively trimming the resistance of the plurality of individual filament sections by using an application of the predetermined voltage.

13. The computer-implemented method of claim 8, wherein applying the predetermined voltage laterally through the first layer comprises applying the predetermined voltage uniformly though a plurality of filamentary sections within the first layer.

14. The computer-implemented method of claim 8, further comprising applying a different predetermined voltage to each respective filamentary section within the plurality of filamentary section within the first layer.

15. A computer system comprising:
   one or more computer processors;
   one or more computer readable storage media; and
   program instructions stored on the one or more computer readable storage media for execution by at least one of the one or more processors, the program instructions comprising:
      program instructions to identify at least two filamentary channels within a first layer made of a metal-oxide within a voltage resistance controlling apparatus by using a plurality of sensor devices;
      program instructions to identify a plurality of filamentary sections parallel to the at least two filamentary channels within the first layer within the voltage resistance controlling apparatus;
      program instructions to enable resistance tuning in at least one identified filamentary section within the plurality of sections parallel to the at least two filamentary channels within the first layer within the voltage resistance controlling apparatus; and
      program instructions to apply a predetermined voltage laterally through the at least one identified filamentary section within the first layer via the at least two identified filamentary conductive channels.

16. The computer system of claim 15, wherein the program instructions to identify the at least two filamentary conductive channels comprise program instructions to determine a flow of a plurality of charged ions through the first layer, wherein the flow of charged ions require a conductive medium to transport charged ions via the at least two filamentary conductive channels.

17. The computer system of claim 16, wherein the program instructions to determine the flow of the plurality of charged ions through the first layer comprise:
   program instructions to determine the flow of the plurality of charged ions through at least the two identified filamentary channels at a first fixed period of time; and
   program instructions to determine the flow of the plurality of charged ions through the at least two identified filamentary channels at a second fixed period of time, wherein there is a difference of at least three seconds between the first fixed period of time and the second period of time.

18. The computer system of claim 15, wherein the program instructions to enable resistance tuning in at least one identified filamentary section comprise program instructions to transmit instructions to the plurality of the identified filamentary sections to receive charged ions through the at least two filamentary channels within the first layer.

19. The computer system of claim 15, wherein the program instructions to enable resistance tuning in at least one identified filamentary section comprise program instructions to selectively trim the resistance of the plurality of individual filament sections by using an application of the predetermined voltage.

20. The computer system of claim 15, wherein the program instructions to apply the predetermined voltage laterally through the first layer comprise program instructions to apply the predetermined voltage uniformly though a plurality of filamentary sections within the first layer.

\* \* \* \* \*